(12) United States Patent
Kato (10) Patent No.: US 7,419,906 B2
(45) Date of Patent: Sep. 2, 2008

(54) METHOD FOR MANUFACTURING A THROUGH CONDUCTOR

(75) Inventor: Osamu Kato, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 123 days.

(21) Appl. No.: 11/387,780

(22) Filed: Mar. 24, 2006

(65) Prior Publication Data

US 2006/0216921 A1      Sep. 28, 2006

(30) Foreign Application Priority Data

Mar. 25, 2005   (JP)   ............................. 2005-087643

(51) Int. Cl.
*H01L 21/44*   (2006.01)

(52) U.S. Cl. ...................... 438/668; 438/700; 438/672; 257/E21.17; 257/E21.229; 257/E21.231; 257/E21.304; 257/E21.305

(58) Field of Classification Search ................ 438/668, 438/270, 700, 672, 682, 706, 745, 722, 743, 438/733, 678, 692, 106, 753
See application file for complete search history.

(56) References Cited

U.S. PATENT DOCUMENTS

| 5,021,842 A | * | 6/1991 | Koyanagi | 257/305 |
| 5,119,155 A | * | 6/1992 | Hieda et al. | 257/304 |
| 5,170,372 A | * | 12/1992 | Wong | 257/304 |
| 5,302,542 A | * | 4/1994 | Kishi et al. | 438/152 |
| 5,618,745 A | * | 4/1997 | Kita | 438/164 |
| 6,087,719 A |   | 7/2000 | Tsunashima | 257/686 |

FOREIGN PATENT DOCUMENTS

| JP | 10-223833 | 8/1998 |
| JP | 2000-124302 | 4/2000 |
| JP | 2003-007777 | 1/2003 |
| JP | 2004-14657 | 1/2004 |

* cited by examiner

*Primary Examiner*—David Nhu
(74) *Attorney, Agent, or Firm*—Rabin & Berdo, PC (57) ABSTRACT

A method of manufacturing a through conductor that penetrates from an upper surface of a silicon substrate to its lower surface. The through conductor is manufactured in steps which provide a first conductor which extends in the direction of thickness of the silicon substrate from the upper surface of the silicon substrate, and a second conductor which has a size in the direction orthogonal to the thickness direction is smaller than that of the first conductor and which penetrates the silicon substrate from a bottom face of the first conductor to the lower surface of the silicon substrate.

14 Claims, 5 Drawing Sheets

METHOD FOR MANUFACTURING A THROUGH CONDUCTOR

BACKGROUND OF THE INVENTION

The present invention relates to a through conductor such as a through electrode which penetrates a silicon substrate such as a package substrate with a semiconductor chip mounted thereon, a chip substrate of the semiconductor chip or the like and electrically connects the front and back sides of the silicon substrate, and a method for manufacturing the through conductor.

As a conventional through electrode, e.g., a through electrode provided in its corresponding semiconductor chip employed in a semiconductor package in which a plurality of semiconductor chips are laminated, there is formed a through electrode of a silicon (Si) substrate such as a wafer used as a chip substrate of the semiconductor chip, which is characterized by forming a mask pattern in a region excluding a region for forming the through electrode, etching the silicon substrate exposed by dry etching to form an electrode forming hole with a bottom, covering the bottom face and side face of the electrode forming hole with an insulating film comprised of silicon dioxide ($SiO_2$) by a CVD (Chemical Vapor Deposition) method, thereafter forming a seed film by sputter, the CVD method or the like, embedding a conductor formed of a metal having conductivity into the electrode forming hole by a plating method or the like, and thereafter polishing the lower surface of the silicon substrate to expose the conductor to the bottom face of the electrode forming hole, thereby penetrating from an upper surface of the silicon substrate to its lower surface so as to electrically connect the upper surface side and the lower surface side (refer to, for example, a patent document 1 (Japanese Unexamined Patent Publication No. Hei 10 (1998)-223833 (paragraph 0061 in page 6-paragraph 0082 in page 7, FIG. 4 and FIG. 5)).

However, the above prior art has problems in that since the through electrode is formed as a circular cylinder which penetrates from the upper surface of the silicon substrate to the lower surface thereof, an electrolytic solution is hard to enter the electrode forming hole upon embedding of the conductor by an electrolytic plating method or the like when the aspect ratio (ratio between the diameter of hole and its depth) of its through electrode hole exceeds 10, and the mouth of the electrode forming hole is first blocked off, thereby causing the difficulty of filling the electrode forming hole with the conductor.

SUMMARY OF THE INVENTION

The present invention has been made to solve the foregoing problems. It is therefore an object of the present invention to provide means which enhances embeddability of a conductor where a through electrode is formed as a through conductor large in aspect ratio.

According to one aspect of the present invention, for attaining the above object, there is provided a through conductor comprised of a conductor that penetrates from an upper surface of a silicon substrate to a lower surface thereof, comprising a first conductor extending in the direction of thickness of the silicon substrate from the upper surface of the silicon conductor, and a second conductor whose size in the direction orthogonal to the thickness direction is smaller than that of the first conductor penetrating from a bottom face of the first conductor to the lower surface of the silicon substrate.

According to another aspect of the present invention, for attaining the above object, there is provided a method for manufacturing a through conductor provided with a first conductor which extends in the direction of thickness of a silicon substrate from an upper surface of the silicon substrate, and a second conductor whose size in the direction orthogonal to the thickness direction is smaller than that of the first conductor penetrating from a bottom face of the first conductor to a lower surface of the silicon substrate, comprising the steps of forming an oxide film on the upper surface of the silicon substrate, forming, over the oxide film, a resist mask having an opening of a size equal to a size of a second electrode forming hole for forming the second conductor at a portion where the through conductor is formed, etching the oxide film by anisotropic etching with the resist mask as a mask to expose the upper surface of the silicon substrate to the opening, removing the resist mask and etching the silicon substrate exposed by anisotropic etching with the exposed oxide film as a mask to form a deep hole, removing the oxide film at a mouth of the deep hole by isotropic etching to expose the upper surface of the silicon substrate, having a size equal to a size of a first electrode forming hole for forming the first conductor, etching the silicon substrate exposed by anisotropic etching with the retreated oxide film as a mask to form the first electrode forming hole and form the second electrode forming hole, removing the oxide film and forming an insulating film over the exposed upper surface of silicon substrate and inner faces of the first and second electrode forming holes, forming a base metal layer over the insulating film, and plating a conductor onto the base metal layer to fill the first and second electrode forming holes with the conductor, thereby forming the first and second conductors.

Thus, the present invention can bring about advantageous effects in that even when the size of the second electrode forming hole for forming the second conductor is small, the aspect ratio of the second electrode forming hole can be set small by the depth of the first electrode forming hole for forming the first conductor, the mouth of the first electrode forming hole can be prevented from being blocked off first upon embedding of the conductor by a plating method, and the embeddability of the conductor that forms the through conductor can be enhanced.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Through conductors according to the present invention and preferred embodiments of their manufacturing methods will hereinafter be described with reference to the accompanying drawings.

First Preferred Embodiment

FIGS. 1A-1D, 2A-2D and 3A-3B are respectively explanatory views showing a method for manufacturing a through electrode, according to a first embodiment.

Incidentally, FIGS. 1A through 3B are respectively sectional views showing, as partly enlarged views, the neighborhood of the through electrode formed in a silicon substrate.

In FIGS. 1A through 3B, reference numeral 1 indicates a silicon substrate such as a package substrate of a semiconductor package formed of silicon or a chip substrate of a semiconductor chip formed of silicon.

Reference numeral 2 indicates an oxide film. It is a film which is formed in an upper surface 1a of the silicon substrate 1 and which functions as a mask member formed of a material such as silicon dioxide selected in such a manner that an etching selection ratio to silicon is obtained upon dry etching.

Reference numeral 3 indicates a stepped electrode forming hole, which is a stepped hole with a bottom, having a large hole section (first electrode forming hole) 3a whose size extending in the direction orthogonal to the direction of thickness of the silicon substrate 1, which extends from its upper surface 1a to its lower surface 1b, is large, and a small hole section (second electrode forming hole) 3b smaller in size than the large hole section 3a. This is a hole for embedding a conductor 4 comprised of a metal having conductivity, such as copper (Cu), silver (Ag) or the like in the stepped electrode forming hole 3 and forming a through electrode 5 as a through conductor.

Sectional shapes of the large hole section 3a and small hole section 3b employed in the present embodiment as viewed in the directions orthogonal to their thickness directions are configured in circular form. The size of the small hole section 3b as viewed in the direction orthogonal to its thickness direction, i.e., its diameter is formed on the order of 10 μm or so, and the depth of the stepped electrode forming hole 3 is formed on the order of 100 μm or so.

Figure 3A:
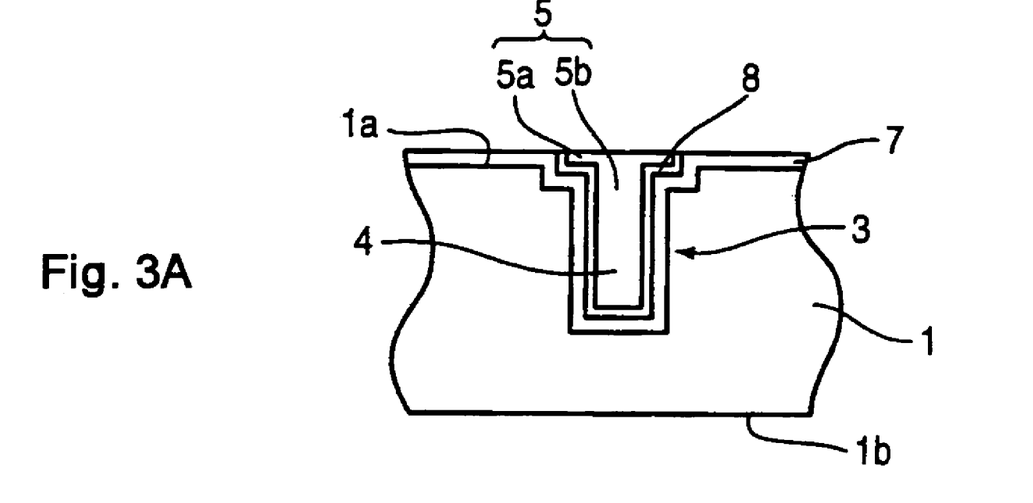
FIGS. 3A-3B are an explanatory view depicting the through electrode manufacturing method according to the first embodiment.
Figure 3B:
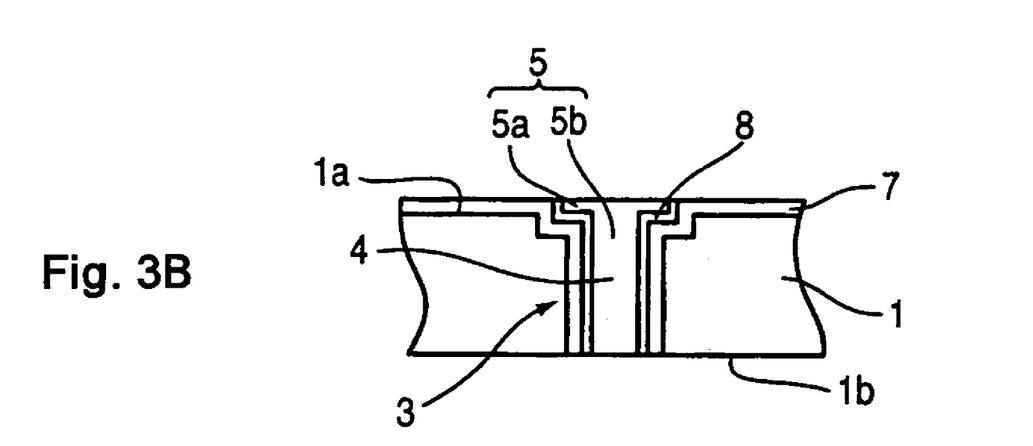

The through electrode 5 is a stepped axis having conductivity, which is formed by a thick or heavy axial portion (first conductor) 5a formed by embedding the conductor 4 into the large hole section 3a and a thin axial portion (second conductor) 5b formed by embedding the conductor 4 into the small hole section 3b. The through electrode 5 has the function of electrically connecting an upper surface 1a side of the silicon substrate 1 from which the thick axial portion 5a is exposed, and a lower surface 1b side of the silicon substrate 1 from which the thin axial portion 5b is exposed.

Reference numeral 7 indicates an insulating film, which is a film formed of silicon dioxide or the like, having electrical insulation. In the present embodiment, the insulating film is formed on the side faces and bottom faces (inner faces) of the large hole section 3a and small hole section 3b of the stepped electrode forming hole 3 and the upper surface 1a of the silicon substrate 1.

Reference numeral 8 indicates a base metal layer formed between the insulating film 7 and the conductor 4. The base metal layer 8 is formed by laminating a seed film on the conductor 4 side on a barrier metal film on the insulating film 7 side. In this case, any material may be used for the seed film if materials good in adhesion to the conductor 4 are used. The same material as the conductor 4, e.g., copper is used in the present embodiment.

Figure 1A:
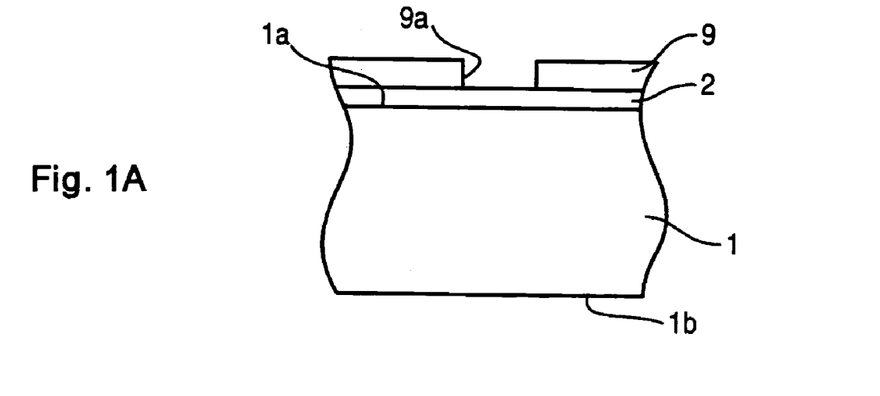
FIGS. 1A-1D are an explanatory view showing a method for manufacturing a through electrode, according to a first embodiment.

Reference numeral 9 indicates a resist mask, which is a mask member formed by exposing a resist applied onto the upper surface 1a of the silicon substrate 1 to light by photolithography and thereafter subjecting it to development.

The method for manufacturing the through electrode, according to the present embodiment will hereinafter be described in accordance with process steps indicated in FIGS. 1A through 3B.

In FIG. 1A, a silicon substrate 1 such as a wafer or like formed by slicing cylindrical silicon is prepared. An oxide film 2 comprised of silicon dioxide is formed in an upper surface 1a of the silicon substrate 1 by a thermal oxidation method or a CVD method. A resist mask 9 formed with an opening or aperture 9a equivalent in diameter to a small hole section 3b by photolithography at a portion on the oxide film 2, for forming the through electrode 5 is formed.

Figure 1B:
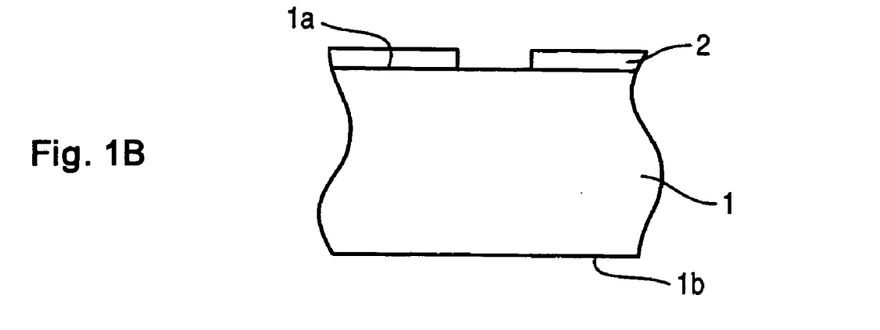

In FIG. 1B, the oxide film 2 of the opening 9a is etched by dry etching corresponding to anisotropic etching with the resist mask 9 formed as a mask to expose the upper surface 1a of the silicon substrate 1, after which the resist mask 9 is removed using a release agent or remover.

Figure 1C:
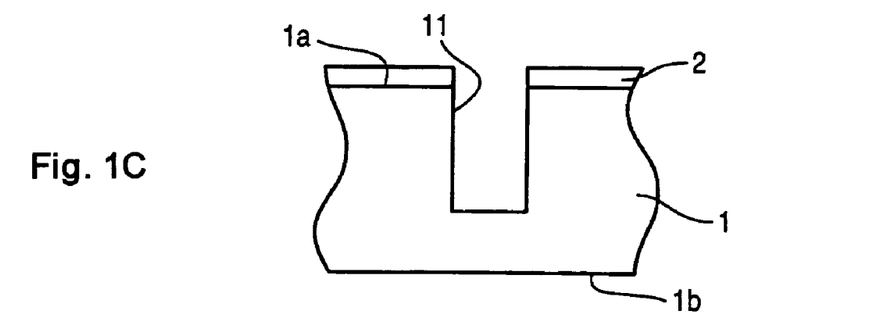

In FIG. 1C, the exposed silicon substrate 1 is etched by dry etching using a mixed gas of sulphur hexafluoride ($SF_6$), oxygen ($O_2$) and the like with the oxide film 2 exposed by the removal of the resist mask 9 as a mask to form a deep hole 11 having a depth of 100 μm with a diameter equal to that of the opening 9a.

Figure 1D:
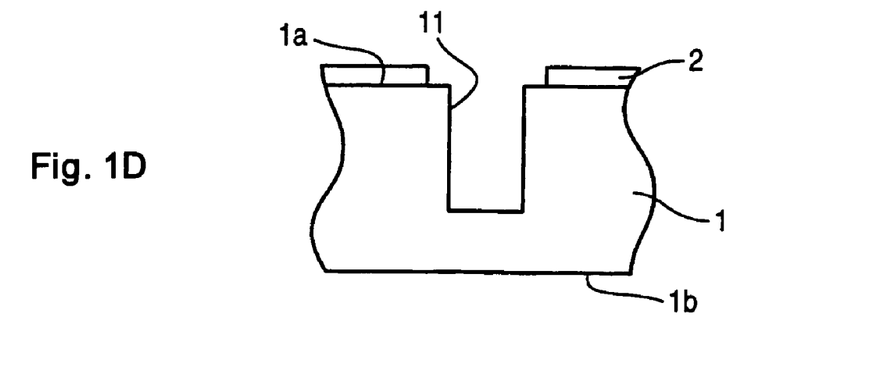

In FIG. 1D, the oxide film 2 is etched by wet etching using diluted hydrofluoric acid (HF) or the like corresponding to isotropic etching to retreat or back off the oxide film 2 at the entrance or mouth of the deep hole 11 in such a manner that it has a diameter equal to the diameter of the large hole section 3a of the stepped electrode forming hole 3 and remove it, thereby exposing the upper surface 1a of the silicon substrate 1 in the neighborhood of the mouth of the deep hole 11.

Figure 2A:
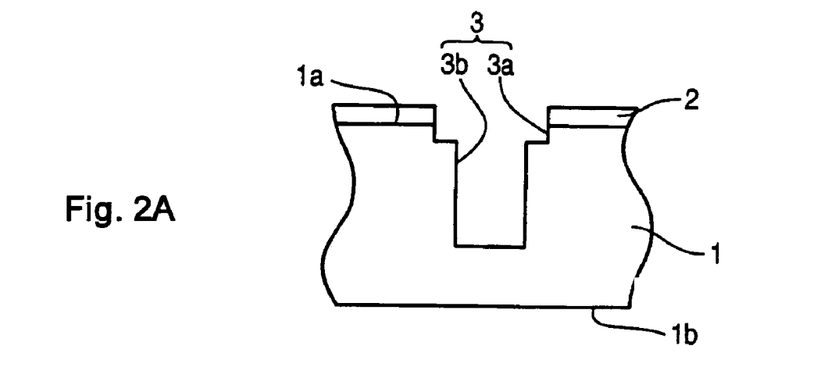
FIGS. 2A-2D are an explanatory view illustrating the through electrode manufacturing method according to the first embodiment.

In FIG. 2A, the exposed silicon substrate 1 is etched again by dry etching using the mixed gas of sulphur hexafluoride ($SF_6$), oxygen ($O_2$) and the like with the retreated oxide film 2 as a mask to thereby form a large hold section 3a and form a small hole section 3b by the remaining deep hole 11, thereby forming a stepped electrode forming hole 3 comprised of the large hole section 3a and the small hole section 3b. In this case, the depth of the large hole section 3a is set in such a manner than the aspect ratio of the small hole section 3b becomes 10 or less.

Figure 2B:
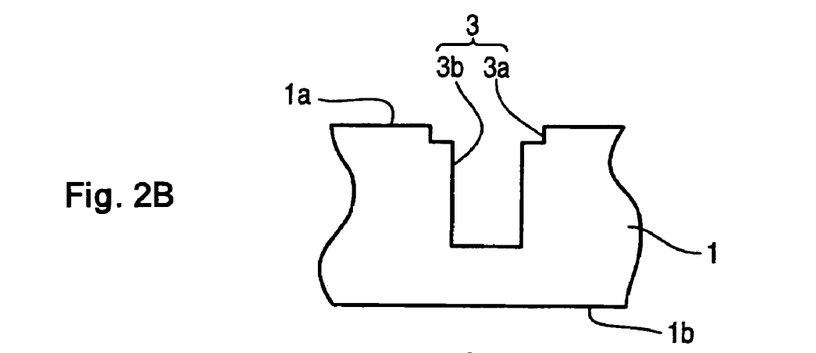

In FIG. 2B, the oxide film 2 on the upper surface 1a of the silicon substrate 1 is all removed by wet etching using hydrofluoric acid or the like.

Figure 2C:
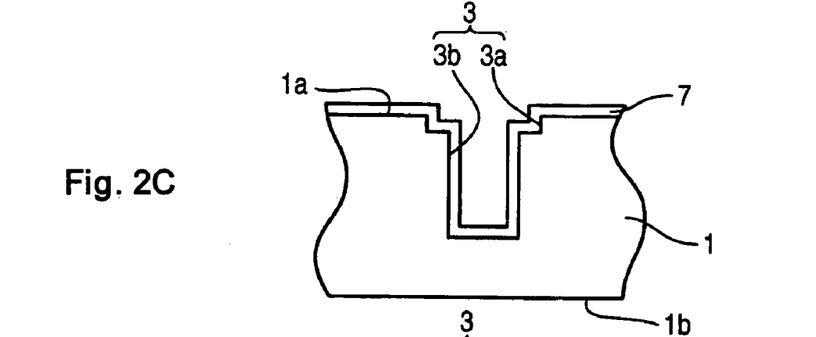
Figure 2D:
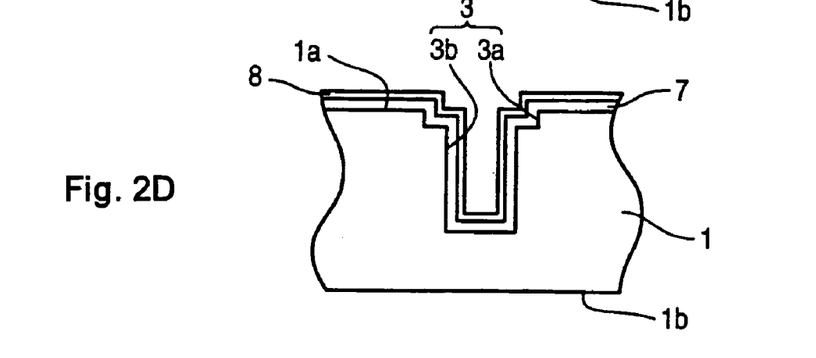

In FIG. 2C, an insulating film 7 comprised of silicon dioxide is formed in the upper surface 1a of the silicon substrate 1 exposed by removal of the oxide film 2 and the inner faces of the large hole section 3a and small hole section 3b of the stepped electrode forming hole 3 by the thermal oxidation method or CVD method.

In FIG. 2D, a barrier metal film is formed on the formed insulating film 7 by a sputter method or a CVD method. A seed film is laminated on the barrier metal film by the sputter method or the CVD method to form a base metal layer 8.

In FIG. 3A, a conductor 4 is plated onto the base metal layer 8 by a plating method such as an electrolytic plating method to embed the conductor 4 into the stepped electrode forming hole 3, whereby the capacity lying inside the base metal layer 8 on the large hole section 3a and small hole section 3b of the stepped electrode forming hole 3 is filled with the conductor 4. Then, the upper surface 1a side of the silicon substrate 1 is polished by a CMP (Chemical Mechanical Polishing) method or the like to remove the base metal layer 8 and the conductor 4 plated thereon, thereby exposing the insulating film 7 on the upper surface 1a of the silicon substrate 1. Thus, a thick axial portion 5a of the through electrode 5 is formed by the conductor 4 embedded in the large hole section 3a of the stepped electrode forming hole 3, and its upper surface is exposed to the upper surface 1a side of the silicon substrate 1. Further, a thin axial portion 5b is formed by the conductor 4 embedded in the small hole section 3b.

Thereafter, the upper surface 1a side of the silicon substrate 1 is processed by, for example, forming wiring patterns and pads or the like for electrically connecting the upper surface of the thick axial portion 5a and predetermined portions, on the insulating film 7 on the upper surface 1a side of the silicon substrate 1 by using photolithography or the like.

In FIG. 3B, the lower surface 1b of the silicon substrate 1 is back ground or polished by the CMP method or the like after the processing of the upper surface 1a side of the silicon substrate 1 to thereby thin the silicon substrate 1 and expose the thin axial portion 5b to the lower surface 1b thereof.

Thus, the through electrode 5 shaped with the step, according to the present embodiment is formed which comprises the thick axial portion 5a extending in the thickness direction of the silicon substrate 1 by the conductor 4 embedded in the large hole section 3a of the stepped electrode forming hole 3, and the thin axial portion 5b extending through the lower surface 1b of the silicon substrate 1 from the bottom face of the thick axial portion 5a by the conductor 4 embedded in the small hole section 3b. The through electrode 5 electrically connects the upper surface 1a side of the silicon substrate 1 and the lower surface 1b side thereof.

Incidentally, a solder bail or the like may be welded to the lower surface of the exposed thin axial portion 5b to form a bump or the like at the lower surface 1b of the silicon substrate 1. An insulating film similar to the upper surface 1a may be formed in the lower surface 1b to form wiring patterns or the like.

A wafer in which the silicon substrate 1 such as the package substrate, chip substrate or the like formed with the through electrode 5 by the manufacturing method of the present embodiment in the above-described manner is formed in a plural fashion, is manufactured.

When the silicon substrate 1 is used as the chip substrate of the semiconductor chip, the through electrodes 5 of the present embodiment are formed in a wafer with a plurality of internal circuits formed in the upper surface 1a, and the wafer is individually divided in units of the silicon substrates 1 to manufacture semiconductor chips.

When the silicon substrate 1 is used as the package substrate of the semiconductor package, one or plural semiconductor chips are packaged to a wafer in which the silicon substrate 1 formed with the through electrode 5 of the present embodiment is formed in plural form. Thereafter, the wafer is divided into individual forms in units of the silicon substrates 1 to fabricate semiconductor packages.

In the present embodiment as described above, the through electrode is constituted of the thick axial portion extending in the direction of thickness of the silicon substrate from the upper surface of the silicon substrate and the thin axial portion extending from the bottom face of the thick axial portion to the lower surface of the silicon substrate and smaller in diameter than the thick axial portion. Thus, even when the inside diameter of the small hole section for forming the thin axial portion is small, the aspect ratio of the small hole section can be set small by the depth of the large hole section for forming the thick axial portion. It is further possible to prevent the mouth of the small hole section from being blocked off precedently upon embedding of the conductor by the electrolytic plating method and improve embeddability of the conductor for forming the through electrode.

With the formation of the through electrode by the cylindrical thick axial portion and the cylindrical thin axial portion, the method for forming the electrode forming hole as a conical or truncated conical shape whose sectional area is reduced from the upper surface of the silicon substrate to its lower surface and thereby preventing blocking off of the mouth of the electrode forming hole at the embedding of the conductor is capable of resolving ununiformity of the shape of the lower surface of the through electrode, which occurs due to a manufacturing error or the like of an inclined surface of the electrode forming hole when the lower surface of the silicon substrate is polished to expose the lower surface of the through electrode and enhancing uniformity of the shape of the lower surface of the through electrode exposed to the lower surface of the silicon substrate by grinding in the process step shown in FIG. 1A. This is effective in ensuring conductivity at axial thinning with the miniaturization of the through electrode.

Second Preferred Embodiment

FIGS. 4A-4D and 5A-5D are explanatory views showing a method for manufacturing a through electrode, according to a second embodiment.

Incidentally, FIGS. 4A-4D and 5A-5D are respectively sectional views showing, as partly enlarged views, the neighborhood of the through electrode formed in a silicon substrate. Constituent portions similar to those employed in the first embodiment are given the same reference numerals and their explanations are omitted.

In FIGS. 4A-4D and 5A-5D, reference numeral 21 indicates a first base metal layer, which is formed by laminating a seed film on a barrier metal film in a manner similar to the base metal layer 8 of the first embodiment.

Figure 5A:
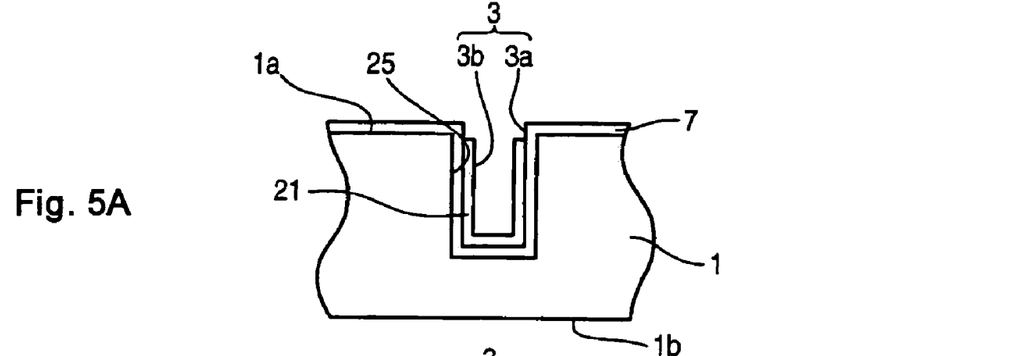
FIGS. 5A-5D are an explanatory view illustrating the through electrode manufacturing method according to the second embodiment.
Figure 5B:
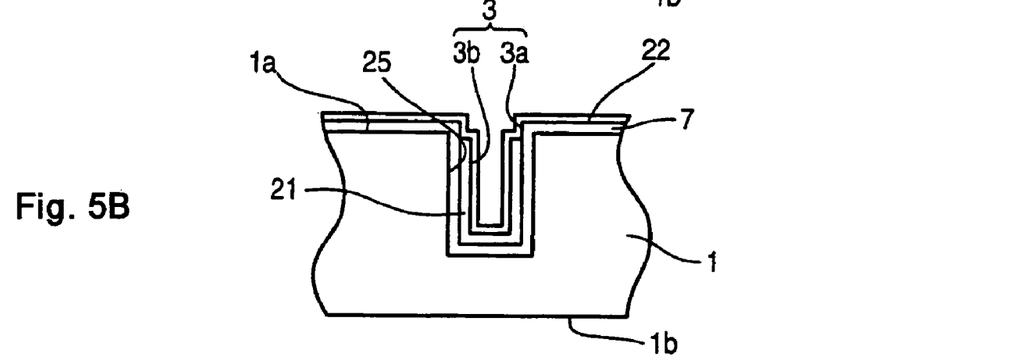
Figure 5C:
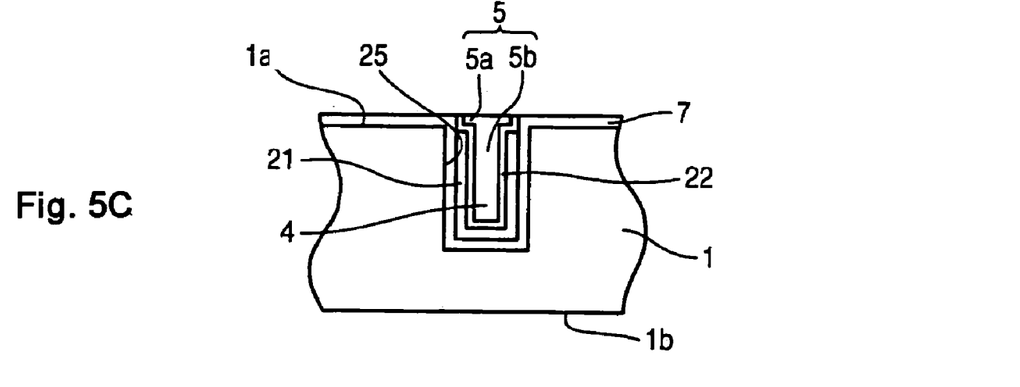
Figure 5D:
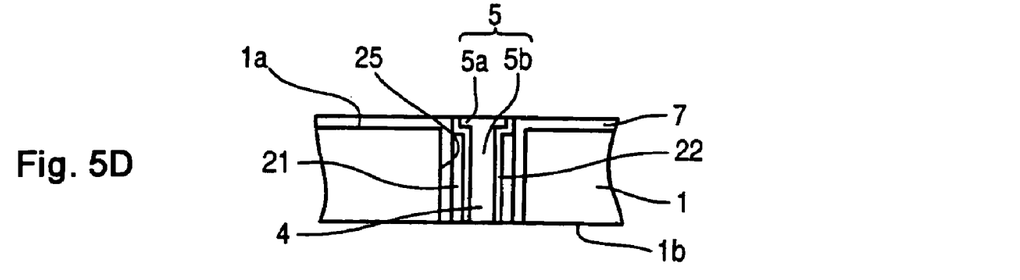

Reference numeral 22 indicates a second base metal layer, which is formed by laminating a seed film on a barrier metal film in a manner similar to the base metal layer 8 of the first embodiment.

A stepped electrode forming hole 3 employed in the present embodiment is of a stepped hole with a bottom, which is constituted of a large hole section (first electrode forming hole) 3a formed by polishing the first base metal layer 21 by a CMP method, and a small hole section (second electrode forming hole) 3b smaller in size than the large hole section 3a, which is formed by the first base metal layer 21.

The method for manufacturing the through electrode, according to the present embodiment will hereinafter be described in accordance with process steps indicated in FIGS. 4A-4D and 5A-5D.

Figure 4A:
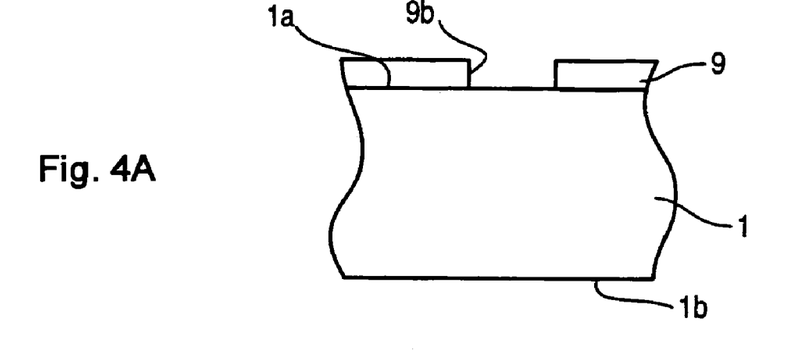
FIGS. 4A-4D are an explanatory view showing a method for manufacturing a through electrode, according to a second embodiment.

In FIG. 4A, a silicon substrate 1 similar to the first embodiment is prepared. A resist mask 9 is formed in which an opening or aperture 9b is formed at a portion where a through electrode 5 on an upper surface 1a of the silicon substrate 1 is formed.

Figure 4B:
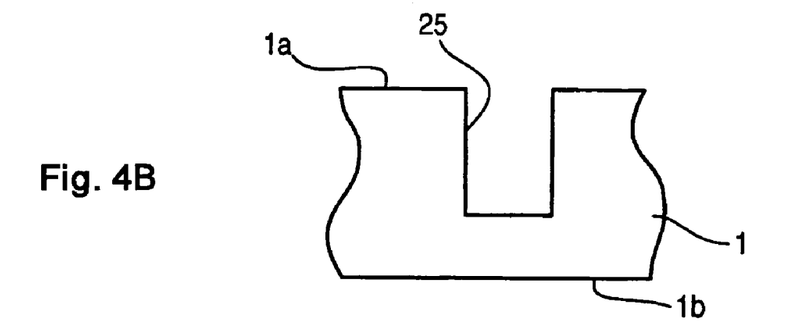

In FIG. 4B, the silicon substrate 1 at the opening 9b is etched by dry etching using a mixed gas of sulphur hexafluoride, oxygen and the like with the resist mask 9 formed as a mask to form a deep hole 25 having a depth of 100 μm with a diameter equal to that of the opening 9b. Then, the resist mask 9 is removed using a release agent or remover.

Figure 4C:
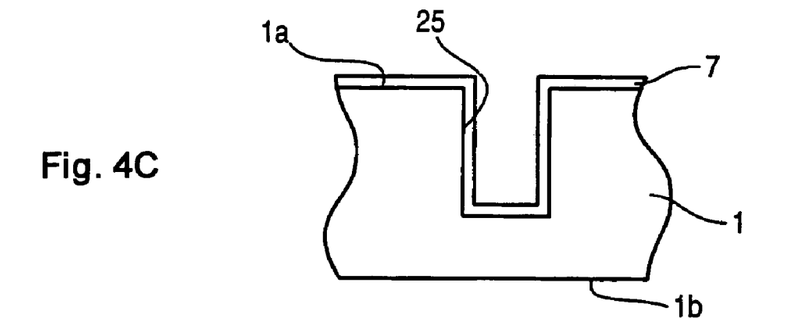

In FIG. 4C, an insulating film 7 comprised of silicon dioxide is formed on the upper surface 1a of the silicon substrate 1 exposed by removal of the resist mask 9 and the inner face of the deep hole 25 by a thermal oxidation method or a CVD method.

Figure 4D:
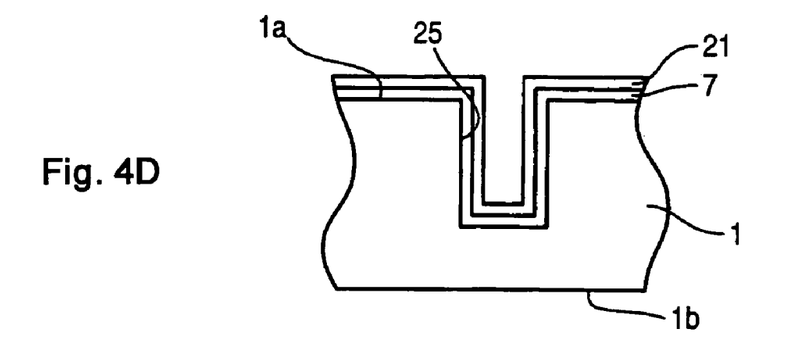

In FIG. 4D, a barrier metal film is formed on the formed insulating film 7 by a sputter method or a CVD method, and a first base metal layer 21 is formed by laminating a seed film on the barrier metal film by the CVD method or the like.

In FIG. 5A, the first base metal layer 21 formed on the upper surface 1a side of the silicon substrate 1 and the first base metal layer 21 formed at the mouth of the deep hole 25 are polished by a CMP method to remove the first base metal layer 21 at the mouth of the deep hole 25 to thereby form a large hole section 3a and form a small hole section 3b by the remaining first base metal layer 21 on the inner face of the deep hole 25, whereby a stepped electrode forming hole 3 constituted of the large hole section 3a and the small hole section 3b is formed. As an abrasive or polishing agent used in the CMP method in this case, an abrasive large in selection ratio, i.e., an abrasive having the properties that the first base metal layer 21 is susceptible to polishing and the insulating film 7 is insusceptible to polishing is used. The depth of the large hole section 3a is set in such a way that the aspect ratio of the small hole section 3b becomes 10 or less.

In FIG. 5B, a barrier metal film is formed over the insulating film 7 of the large hole section 3a, which is exposed by polishing, and the first base metal layer 21 of the small hole section 3b by a sputter method or a CVD method. A seed film is laminated on the barrier metal film by the CVD method or the like to form a second base metal layer 22.

In FIG. 5C, a conductor 4 is plated onto the second base metal layer 22 by a plating method such as an electrolytic plating method to embed the conductor 4 into the stepped electrode forming hole 3, whereby the capacity lying inside the second base metal layer 22 on the large hole section 3a and small hole section 3b of the stepped electrode forming hole 3 is filled with the conductor 4. Then, the upper surface 1a side of the silicon substrate 1 is polished by the CMP method or the like to remove the second base metal layer 22 and the conductor 4 plated thereon, thereby exposing the insulating film 7 on the upper surface 1a of the silicon substrate 1. Thus, a thick axial portion 5a of the through electrode 5 is formed by the conductor 4 embedded in the large hole section 3a of the stepped electrode forming hole 3, and its upper surface is exposed to the upper surface 1a side of the silicon substrate 1. Further, a thin axial portion 5b is formed by the conductor 4 embedded in the small hole section 3b.

Thereafter, the upper surface 1a side of the silicon substrate 1 is processed in a manner similar to the first embodiment.

In FIG. 5D, the silicon substrate 1 is thinned in a manner similar to the process shown in FIG. 3B of the first embodiment after the processing of the upper surface 1a side of the silicon substrate 1 to thereby expose the thin axial portion 5b to the lower surface 1b thereof.

Thus, the through electrode 5 shaped with a step, according to the present embodiment is formed which comprises the thick axial portion 5a extending in the thickness direction of the silicon substrate 1 by the conductor 4 embedded in the large hole section 3a of the stepped electrode forming hole 3, and the thin axial portion 5b surrounded by the first and second base metal layers 21 and 22 extending through the lower surface 1b of the silicon substrate 1 from the bottom face of the thick axial portion 5a by the conductor 4 embedded in the small hole section 3b. The through electrode 5 electrically connects the upper surface 1a side of the silicon substrate 1 and the lower surface 1b side thereof.

A wafer in which the silicon substrate 1 such as the package substrate, chip substrate or the like formed with the through electrode 5 by the manufacturing method of the present embodiment in the above-described manner is formed in a plural fashion, is manufactured. A semiconductor chip and a semiconductor package are manufactured in a manner similar to those described in the first embodiment.

In the present embodiment as described above, an advantageous effect similar to the first embodiment can be obtained even by embedding the conductor into the stepped electrode forming hole formed by the first base metal layer.

The thin axial portion is formed so as to be surrounded by the dual base metal layers. Therefore, the large hole section formed in the process steps shown in FIGS. 2A and 2B of the first embodiment can be formed in one process step shown in FIG. 5A for grinding the first base metal layer. Hence, the efficiency of manufacture of the through electrode formed in the silicon substrate can be enhanced.

Incidentally, although each of the embodiments has explained the number of stages of stepped electrode forming holes as one, the number of stages thereof is not limited to one but may be any number greater than or equal to two. In brief, the number of stages is increased stepwise where one stage cannot meet the conductor upon embedding the conductor in the thin axial portion, and the thin axial portion may be filled with the conductor. In the first embodiment in this case, the large hole section gradually enlarged by repeating the process steps shown in FIGS. 1D and 2A is formed and brought into stepwise form, whereas in the second embodiment, the above-mentioned diameter of deep hole is formed on a large scale depending upon the number of stages in advance, and the small hole section gradually reduced by repeating the process steps shown in FIG. 4D and FIG. 5A is formed and brought into stepwise form.

Although each of the embodiments has explained the sectional shape of the stepped electrode forming hole as the circular form, it may be an elliptical shape or a square shape.

Further, although each of the embodiments has explained the through conductor as the through electrode, the through conductor is not limited to it but may be a registration or alignment mark or the like at the formation of resist masks formed on the upper and lower surfaces of a wafer. In brief, if through conductors each formed by embedding a conductor into a hole high in aspect ratio are adopted, then an advantageous effect similar to each of the embodiments can be obtained even though any one is applied. When the alignment mark is formed, the sectional shape is set to such a shape like a cross type or a hook type that its position and direction can be detected. And it may be formed by a manufacturing method similar to the above through electrode.

While the preferred forms of the present invention have been described, it is to be understood that modifications will be apparent to those skilled in the art without departing from the spirit of the invention. The scope of the invention is to be determined solely by the following claims.

What is claimed is:

1. A method for manufacturing a through conductor comprising the steps of:

providing a silicon substrate having an upper surface and a lower surface;

providing an oxide film on the upper surface of the silicon substrate;

forming a mask having an opening on the oxide film;

etching the oxide film through the mask to form a through hole having a first size;

removing the mask;

etching the silicon substrate through the through hole in the oxide film to form a first hole having the first size through the silicon substrate;

enlarging the size of the through hole in the oxide film from the first size to a second size to provide a second hole by etching the oxide film isotropically and without a mask, the second hole having a width which is greater than that of the first hole; and filling the first and second holes with a conductor.

2. The method according to claim 1, wherein an anisotropic etching is used for the step of etching the silicon substrate to form the first hole.

3. The method according to claim 1, wherein a plating method is used for the step of filling the first and second holes with the conductor.

4. A method for manufacturing a through conductor, comprising the steps of:

providing a silicon substrate having an upper surface and a lower surface;

forming a mask having an opening on the upper surface of the silicon substrate, the opening having a first size;

etching the silicon substrate with the mask which has the opening having the first size to form a first hole in the silicon substrate;

enlarging the size of the opening of the mask from the first size to a second size;

etching the silicon substrate with the mask which has the opening having the second size to form a second hole in the silicon substrate the second hole having a depth which is less than that of the first hole;

filling the first and second holes with a conductor; and polishing the lower surface of the silicon substrate to expose the conductor filled in the first and second holes.

5. The method according to claim 4, wherein an anisotropic etching is used for the steps of etching the silicon substrate to form the first and second holes.

6. The method according to claim 4, wherein an isotropic etching is used for the step of enlarging the size of the opening of the mask.

7. The method according to claim 4, wherein a plating method is used for the step of filling the first and second holes with the conductor.

8. A method for manufacturing a through conductor comprising the steps of:

providing a silicon substrate having an upper surface and a lower surface;

forming a mask having an opening on the upper surface of the silicon substrate;

etching the silicon substrate with the mask to form a hole in the silicon substrate;

forming a metal layer over an inner face of the hole;

removing the metal layer at a mouth of the hole;

filling the hole with a conductor after the step for removing the metal layer at the mouth of the hole; and polishing the lower surface of the silicon substrate to expose the conductor filled in the hole.

9. The method according to claim 8, wherein an anisotropic etching is used for the step of etching the silicon substrate to form the hole.

10. The method according to claim 8, wherein a plating method is used for the step of filling the hole with the conductor.

11. A method for manufacturing a through conductor provided with a first conductor which extends in the direction of thickness of a silicon substrate from an upper surface of the silicon substrate, and a second conductor whose size in the direction orthogonal to the thickness direction is smaller than that of the first conductor penetrating from a bottom face of the first conductor to a lower surface of the silicon substrate, the method comprising the steps of:

forming an oxide film on the upper surface of the silicon substrate;

forming, over the oxide film, a resist mask having an opening of a size equal to a size of a second electrode forming hole for forming the second conductor at a portion where the through conductor is formed;

etching the oxide film by anisotropic etching with the resist mask as a mask to expose the upper surface of the silicon substrate to the opening;

removing the resist mask and etching the silicon substrate exposed by anisotropic etching with the exposed oxide film as a mask to form a deep hole;

removing the oxide film at a mouth of the deep hole by isotropic etching to expose the upper surface of the silicon substrate, having a size equal to a size of a first electrode forming hole for forming the first conductor;

etching the silicon substrate exposed by anisotropic etching with the retreated oxide film as a mask to form the first electrode forming hole and form the second electrode forming hole;

removing the oxide film and forming an insulating film over the exposed upper surface of silicon substrate and inner faces of the first and second electrode forming holes;

forming a base metal layer over the insulating film; and plating a conductor onto the base metal layer to fill the first and second electrode forming holes with the conductor, thereby forming the first and second conductors.

12. The method according to claim 11, wherein the step for retreating the oxide film at the mouth of the deep hole and the step for forming the first electrode forming hole with the retreated oxide film as a mask are repeated to form a stepwise electrode forming hole.

13. A method for manufacturing a through conductor provided with a first conductor which extends in the direction of thickness of a silicon substrate from an upper surface of the silicon substrate, and a second conductor whose size in the direction orthogonal to the thickness direction is smaller than that of the first conductor penetrating from a bottom face of the first conductor to a lower surface of the silicon substrate, the method comprising the steps of:

forming, over the upper surface of the silicon substrate, a resist mask having an opening of a size approximately equal to a size of a first electrode forming hole for forming the first conductor at a portion where the through conductor is formed;

etching the silicon substrate exposed by anisotropic etching with the resist mask as a mask to form a deep hole;

removing the resist mask and forming an insulating film over the exposed upper surface of silicon substrate and an inner face of the deep hole;

forming a first base metal layer over the insulating film;

removing the first base metal layer at a mouth of the deep hole by polishing to form the first electrode forming hole and form a second electrode forming hole for forming the second conductor;

forming a second base metal layer over the exposed insulating film and inner faces of the first and second electrode forming holes; and plating a conductor onto the second base metal layer to fill the first and second electrode forming holes with the conductor, thereby forming the first and second conductors.

14. The method according to claim 13, wherein the step for forming the first base metal layer and the step for removing the first base metal layer at the mouth of the deep hole to form the first electrode forming hole are repeated to form a stepwise electrode forming hole.

* * * * *